United States Patent [19]

Karanicolas

[11] Patent Number: 5,721,500
[45] Date of Patent: Feb. 24, 1998

[54] EFFICIENT CMOS AMPLIFIER WITH INCREASED TRANSCONDUCTANCE

[75] Inventor: Andrew N. Karanicolas, Marlboro Township, Monmouth County, N.J.

[73] Assignee: Lucent Technologies Inc., Murray Hill, N.J.

[21] Appl. No.: 597,776

[22] Filed: Feb. 7, 1996

[51] Int. Cl.$^6$ ............................. H03F 3/26; H04B 1/26
[52] U.S. Cl. ..................... 327/113; 327/105; 327/356; 327/562
[58] Field of Search ........................ 327/560–563, 327/103, 113, 114, 356, 358, 359, 105; 330/264, 265, 270

[56] References Cited

U.S. PATENT DOCUMENTS

| | | | |
|---|---|---|---|
| 4,335,360 | 6/1982 | Hoover | 330/265 |
| 4,384,261 | 5/1983 | Yokoyama | 330/265 |
| 4,433,303 | 2/1984 | Sasaki | 330/265 |
| 5,221,910 | 6/1993 | Tournier | 330/269 |
| 5,351,012 | 9/1994 | Toumazou | 330/265 |
| 5,568,093 | 10/1996 | Holzer | 330/264 |

FOREIGN PATENT DOCUMENTS 4-273605  9/1992  Japan ................................ 330/262

Primary Examiner—Timothy P. Callahan
Assistant Examiner—T. T. Lam

[57] ABSTRACT

An RF IC having an improved transconductance comprises a first active device of a first conductance type having a gate, a drain and a source and a second active device of a second conductance type having a gate, a drain and a source. The second active device is coupled in series with the first active device. The gate of the first active device is coupled to the gate of the second active device. A current reuse circuit is coupled to the first active device and the second active device wherein a current flowing from the drain of the first active device is reused in the second active device. Whereby transconductance is increased without an increased current utilization and without an increase in noise.

17 Claims, 3 Drawing Sheets

EFFICIENT CMOS AMPLIFIER WITH INCREASED TRANSCONDUCTANCE

FIELD OF THE INVENTION

This invention relates to the field of MOS amplifiers, and more particularly to the field of MOS amplifiers having improved transconductance.

BACKGROUND OF THE INVENTION

The demand for portable wireless communication systems increases the focus on portable RF transceivers. Wireless communications including cellular, satellite systems, radar and other systems typically employ a low-noise receiver. Considerable effort has been expended to develop more sensitive receivers.

Transistor amplifiers have been improved steadily, with emphasis on increased operating frequency. Along with the low noise RF amplifier, a balanced mixer is often used to convert from RF to IF. Balanced operation affords about 20 dB immunity to amplitude noise on the local-oscillator signal. Intermediate frequencies of 30 to 60 MHz are typical, as are 1.5 to 2 dB intermediate-frequency noise figures for the IF preamplifier.

Fine line CMOS process technologies offer potential for RF IC applications. In designing an RF amplifier, the potential for low-power operation is one of the attractive attributes of CMOS technology. A typical CMOS circuit application can provide very low standby power. Current flows in the circuit only when a transition of state is occurring. For an n-channel device the current carriers are electrons, whereas for a p-channel device the carriers are holes. Four separate regions or terminals exist in a MOS transistor: source, drain, gate, and substrate. For normal operation, the source, drain, and gate voltages measured with respect to the substrate are positive for an n-channel device and negative for a p-channel device.

Therefore, there is a need for CMOS transceivers utilizing power efficient low cost IC implementations for front-end circuitry.

SUMMARY OF THE INVENTION

In accordance with the present invention, there is provided an RF IC having an improved transconductance. The device comprising a first active device of a first conductance type having a gate, a drain and a source and a second active device of a second conductance type having a gate, a drain and a source. The second active device is coupled in series with the first active device. The gate of the first active device is coupled to the gate of the second active device. A current reuse circuit is coupled to the first active device and the second active device wherein a current flowing from the drain of the first active device is reused in the second active device. Whereby transconductance is increased without an increased current utilization and without an increase in noise.

An RF LNA IC having an improved transconductance and an RF mixer having an improved transconductance in accordance with the present invention are also described.

BRIEF DESCRIPTION OF THE DRAWINGS

A more complete understanding of the present invention may be obtained from consideration of the following description in conjunction with the drawings in which.

DETAILED DESCRIPTION OF VARIOUS ILLUSTRATIVE EMBODIMENTS

Although the present invention is particularly well suited for use with a 900 MHz CMOS low noise amplifier (LNA) and mixer, and shall be described with respect to this application, the methods and apparatus disclosed here can be applied to other MOS circuits requiring improved transconductance without increased power consumption.

Figure 1:
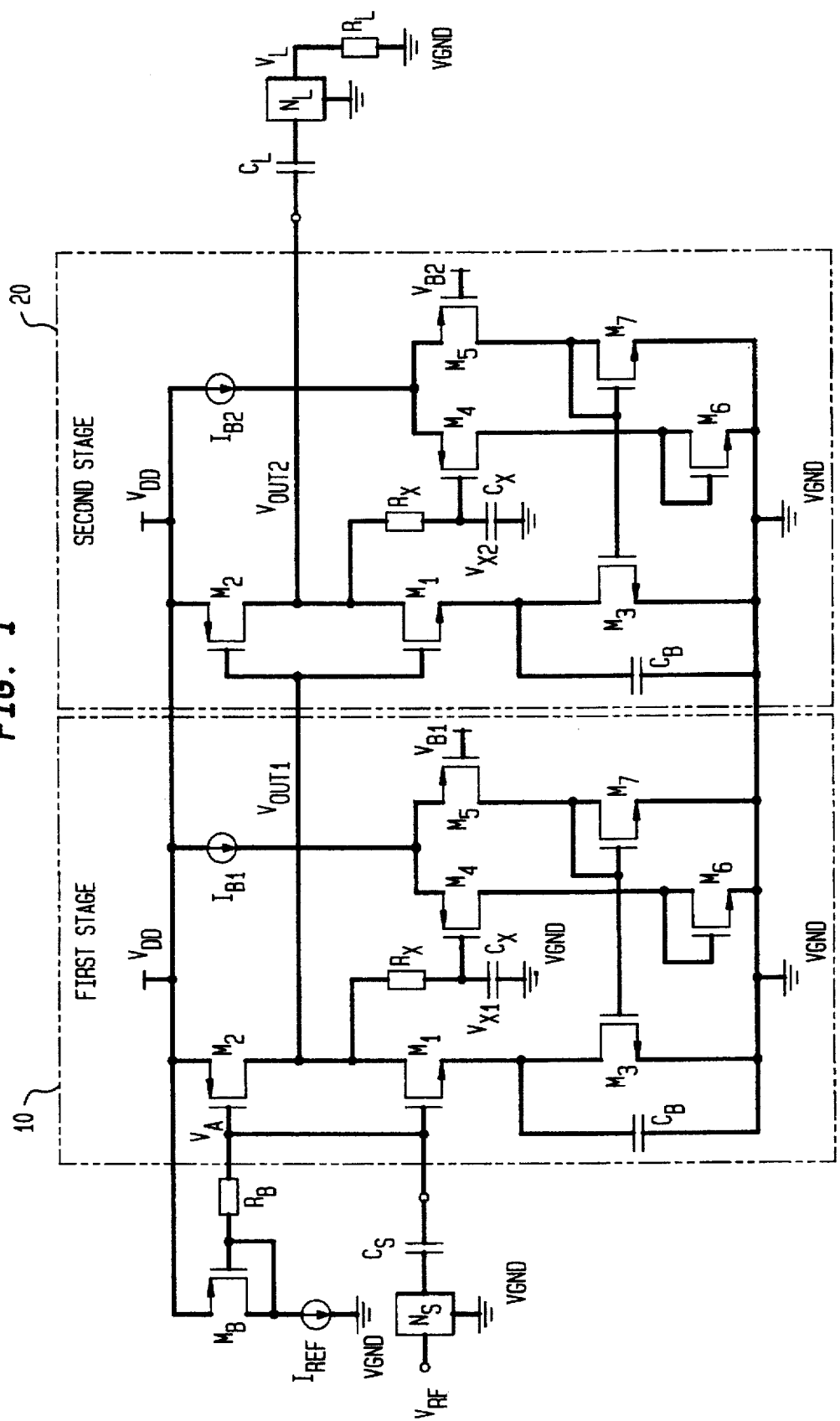
FIG. 1 is a schematic diagram of an RF two stage LNA according to the present invention.

Referring to FIG. 1 there is shown a schematic of a two stage RF LNA according to the present invention. An RF LNA comprises a first stage 10 and a second stage 20. Similar components in the second stage are numbered the same as components in the first stage, as the two stages function in a similar manor. The first stage 10, is comprises of 3 nMOS devices $M_2$, $M_4$ and $M_5$, 4 pMOS devices $M_1$, $M_3$, $M_6$ and $M_7$, resistor $R_x$, capacitors $C_B$ and $C_X$, and current source $I_{B1}$. The gates of devices $M_2$ and $M_1$ are commonly coupled and are known as voltage $V_A$. The source of $M_2$ and current source $I_{B1}$ are coupled to a supply voltage $V_{DD}$. The drain of $M_2$ is coupled to the stage output $V_{OUT1}$, the drain of $M_1$ and one side of $R_X$. Capacitor $C_B$ is coupled between the source and drain of $M_3$. The source of M3 is coupled to $V_{GND}$. The drain of $M_3$ is coupled to the source of $M_1$. The second side of $R_X$ is coupled to the gate of $M_4$. Capacitor $C_X$ is coupled from the gate of $M_4$ to $V_{GND}$. The output of current source $I_{B1}$ is coupled to the source of $M_4$ and the source of $M_5$. The drain of $M_4$ is coupled to the drain of $M_6$ and the gate of $M_6$. The source of $M_6$ is coupled to $V_{GND}$. The drain of $M_5$ is coupled to the drain of $M_7$ and the gate of $M_7$. The gate of $M_3$ is coupled to the gate of $M_7$.

External networks $N_S$ and $N_L$ match the LNA input and output ports to 50 Ω, respectively. The LNA utilizes a cascade connection of two transconductance amplifier stages. One advantage of the two-stage design is that reverse isolation of the LNA is improved in comparison to a single stage design. Another advantage is that by decoupling the input and output ports matching is simplified. An RF signal is applied at $V_{RF}$, which drives MOS gates $M_1$ and $M_2$ in the first stage. Since an external image rejection filter is typically used between the LNA output and the mixer RF input, the LNA output is capable of driving a load resistance $R_L$ of 50 Ω.

As the first and second stage topologies are identical, only the operation of the first stage (single stage) is described herein. Again referring to FIG. 1, devices $M_1$ and $M_2$ are configured such that the transconductance of the stage is $g_m = g_{m1} + g_{m2}$, where $g_{m1}$ is the transconductance of $M_1$ and $g_{m2}$ is the transconductance of $M_2$. Capacitor $C_B$ shunts the source of $M_1$ to ground at high frequencies. Since the drain current of $M_1$ is reused in $M_2$, $g_m$ increases without increasing current consumption, in contrast to a common source amplifier composed of $M_1$ or $M_2$ alone. A bias feedback amplifier sets the dc output voltage $V_{OUT1}$ of the stage to the bias reference $V_{B1}$. Devices $M_3$, $M_4$, $M_5$, $M_6$ and $M_7$ steer bias current into devices $M_1$ and $M_2$. The bias reference $I_{REF}$ and the current mirror which is composed of devices $M_8$ and $M_2$ establish the desired bias current in devices $M_1$ and $M_2$. The bias feedback loop is completed with a low pass filter comprised of $R_X$ and $C_X$. The low pass filter provides dc output voltage $V_{X1}$ from $V_{OUT1}$. The low frequency pole that is contributed by the filter dominates the bias feedback amplifier loop transmission to achieve a high phase margin for the loop. Direct coupling is utilized between the output of the first stage and the input of the second stage. The bias reference $V_{B1}$ sets the dc output voltage $V_{OUT1}$ for the first stage and thus sets the dc input voltage of the second stage, determining the second stage bias current. The second stage bias feedback amplifier sets the dc output voltage $V_{OUT2}$ to bias reference $V_{B2}$. Where $V_A$ is the dc input voltage of the first stage determined by $I_{REF}$ $V_{B1}=V_{B2}=V_A$. Resistors $R_B$ and $R_X$ are chosen sufficiently large to prevent significant input and output loading.

Figure 2:
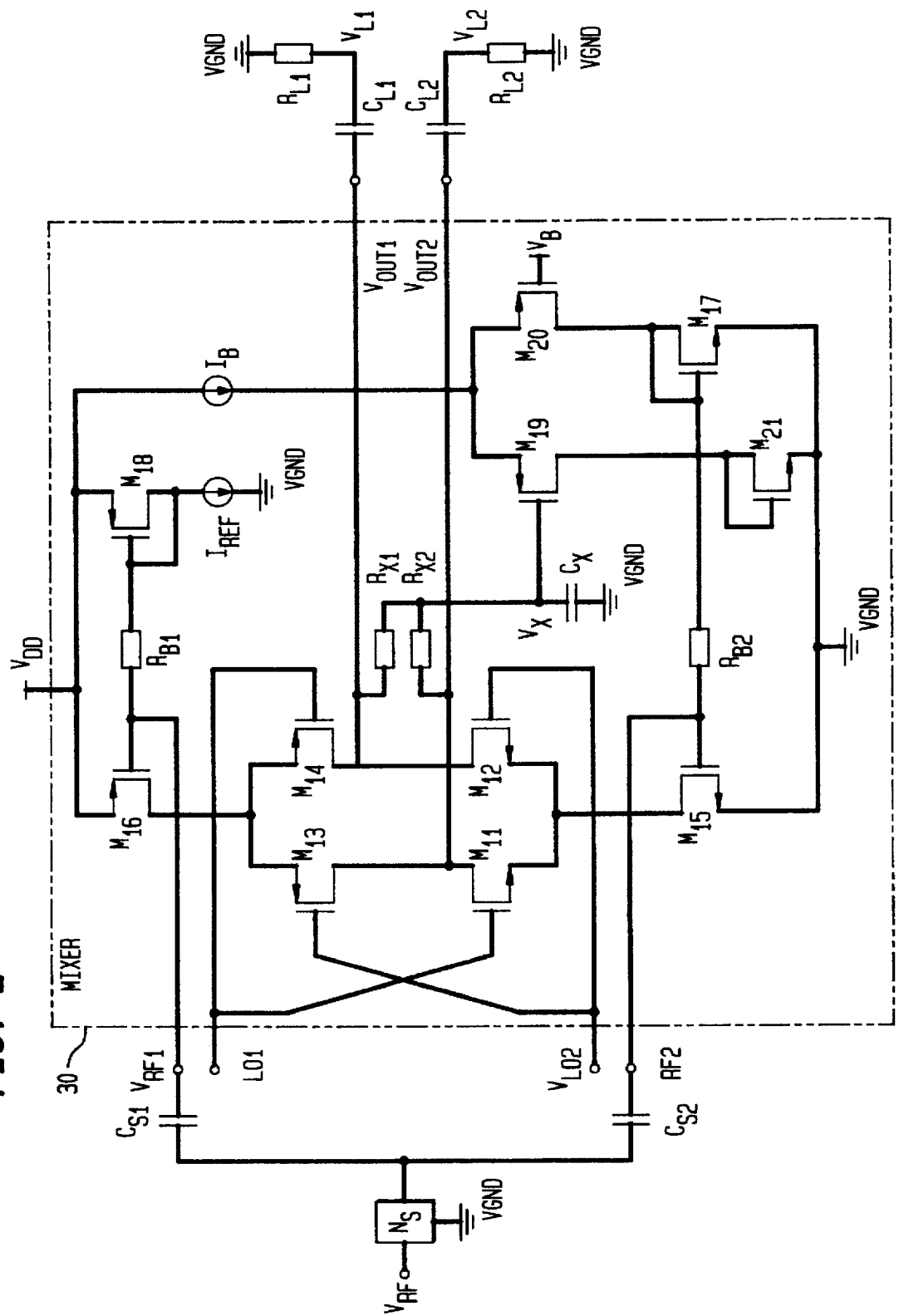
FIG. 2 is a schematic diagram of an RF mixer according according to the present invention.

Referring to FIG. 2 there is shown a schematic of a mixer according to the present invention. The mixer 30 comprises of 4 nMOS devices $M_{13}$, $M_{14}$, $M_{19}$, and $M_{20}$, 5 pMOS devices $M_{11}$, $M_{12}$, $M_{15}$, $M_{17}$, and $M_{21}$, resistors $R_{X1}$, $R_{X2}$, $R_{B1}$ and $R_{B2}$ capacitor $C_X$, and current sources $I_B$ and $I_{REF}$. The gate of $M_{11}$ is coupled to the gate of $M_{14}$ and $V_{LO1}$. The gate of $M_{13}$ is coupled to the gate of $M_2$ and $V_{LO2}$. The source of $M_{16}$, the source of $M_{18}$, and current source $I_B$ are coupled to a supply voltage $V_{DD}$. The gate of $M_{16}$ is coupled to $V_{REF1}$. The gate of $M_{18}$ is coupled to the drain of $M_{18}$. Current source $I_{REF}$ is coupled between the drain of $M_{18}$ and supply voltage $V_{GND}$. Resistor $R_{B1}$ is coupled between the gate of $M_{16}$ and the gate of $M_{18}$. The drain of $M_{16}$ is coupled between the source of $M_{13}$ and the source of $M_{14}$. The drain of $M_{13}$ is coupled to the drain of $M_{11}$. The drain of $M_{14}$ is coupled to the drain of $M_{12}$. The source of $M_{11}$ and the source of $M_{12}$ are coupled to the drain of $M_{15}$. The drain of $M_{15}$ is coupled to $V_{GND}$. $R_{X1}$ is coupled between the drain of $M_{14}$ and the gate of $M_{19}$. The voltage at the gate of $M_{19}$ is called $V_X$. $R_{X2}$ is coupled between the drain of $M_{11}$ and the gate of $M_{19}$. $C_X$ is coupled between the gate of $M_{19}$ and $V_{GND}$. The drain of $M_{11}$ is coupled to $V_{OUT2}$. The drain of $M_{14}$ is coupled to $V_{OUT1}$. The current source is coupled to the source of $M_{19}$ and the source of $M_{20}$. The drain of $M_{19}$ is coupled to the drain of $M_{21}$ and the gate of $M_{21}$. The drain of $M_{20}$ is coupled to the drain of $M_{17}$ and the gate of $M_{17}$. $R_{B2}$ is coupled between the gate of $M_{15}$ and the gate of $M_{17}$. The source of $M_{17}$, the source of $M_{21}$, and the source of $M_{15}$ are coupled to $V_{GND}$.

External networks $N_S$ matches the mixer $R_F$ port to 50 Ω. The RF input is applied at $V_{RF}$, driving $V_{RF1}$ and $V_{RF2}$, and in turn gates $M_{15}$ and $M_{16}$, in phase. Again referring to FIG. 2, devices $M_{15}$ and $M_{16}$ are configured as a transconductance amplifier where $g_m=g_{m15}+g_{m16}$, where $g_{m15}$ is the transconductance of $M_{15}$ and $g_{m16}$ is the transconductance of $M_{16}$. The mixer amplifier uses the design principle used for the LNA stages such that $g_m$ is increased while the drain current is reused, thus avoiding increased current consumption for increased $g_m$. The cross coupled devices $M_{11}$, $M_{12}$, $M_{13}$ and $M_{14}$ comprise the main mixer cell which is driven by the differential local oscillator (LO) inputs $V_{LO1}$ and $V_{LO2}$. The drain currents of devices $M_{15}$ and $M_{16}$ are steered through devices $M_{11}$ and $M_{13}$ or through devices $M_{12}$ and $M_{14}$, as a function of the LO phase. When an input $V_{RF}$ is applied, the drain currents of $M_{15}$ and $M_{16}$ differ by $g_m V_{RF}$. This difference current is then chopped by the mixer cell resulting in the desired IF current at the output ports $V_{OUT1}$ and $V_{OUT2}$ of the mixer. The high impedance mixer outputs are capable of driving an external high impedance IF filter.

Biasing of the mixer is similar to that used for the LNA stages. A common mode feedback amplifier sets the dc common mode output level of the mixer, $V_X$, to the bias reference $V_B$. A differential pair and current mirror are comprised of MOS devices $M_{15}$, $M_{17}$, $M_{19}$, $M_{20}$, and $M_{21}$, which steer the bias current into the mixer cell. Bias reference $I_{REF}$ and a current mirror comprised of MOS devices $M_8$ and $M_{16}$ establish the desired bias current in the mixer cell. A low pass filter completes the feedback loop. The low pass filter is comprised of $R_{X1}$, $R_{X2}$ and $C_X$. This provides the dc common mode level $V_X$ from outputs $V_{OUT1}$ and $V_{OUT2}$. Resistors $R_{B1}$, $R_{B2}$, $R_{X1}$ and $R_{X2}$ are selected sufficiently large to prevent significant input and output loading.

Figure 3:
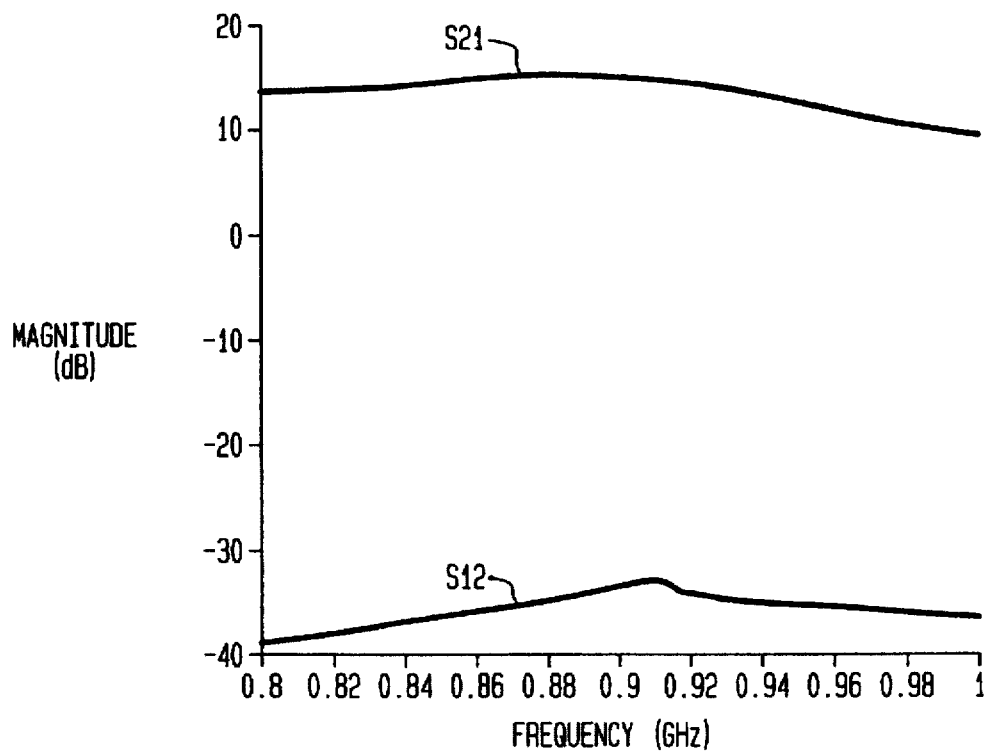
FIG. 3 is a graph of the measured IC LNA gain magnitudes $|S_{21}|$ and $|S_{12}|$.

Referring to FIG. 3 there is shown a graph of the measured LNA forward and reverse gain magnitudes, $|S_{21}|$ and $|S_{12}|$, respectively.

Figure 4:
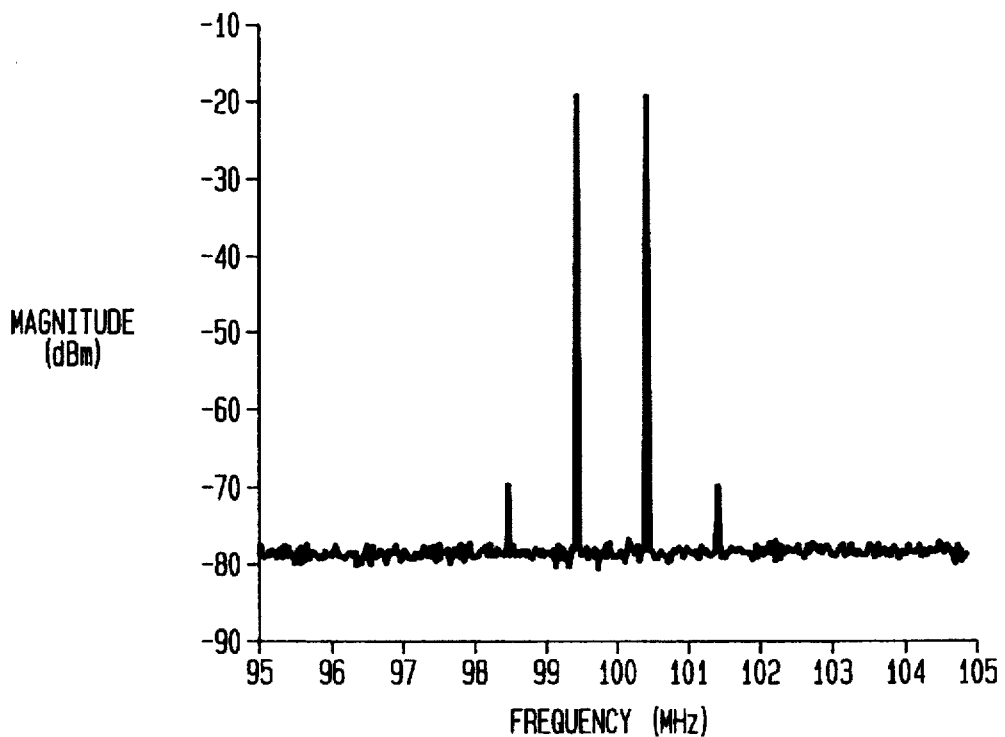
FIG. 4 is a graph of the measured IC mixer IF output spectrum.

Referring to FIG. 4 there is shown a graph of the measured mixer IF output spectrum when a two tone RF input at 899.5 Mhz and 900.5 Mhz is mixed with a LO frequency at 1 Ghz. The RF power level is 29 dBm for each tone. The LO power level is 0 dBm.

The LNA and mixer designs utilize external coupling capacitors at the input and output ports. The fabricated devices were measured in TQFP packages and were fabricated in a 0.5 μm CMOS process. The active area of the LNA IC is 0.7 mm×0.4 min. The active area of the LNA IC mixer is 0.7 mm×0.2 min.

Numerous modifications and alternative embodiments of the invention will be apparent to those skilled in the an in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. An RF IC having an improved transconductance, the device comprising:

a first active device of a first conductivity type having a first transconductance, a gate, a drain and a source;

a second active device of a second conductivity type having a second transconductance, a gate, a drain and a source, said second active device coupled in series with said first active device and said gate of said first active device is coupled to said gate of said second active device;

a current reuse circuit is coupled to said first active device and said second active device wherein a current flowing from said drain of said first active device is reused in said second active device;

a low pass filter coupled between said current reuse circuit and said drain of said first active device and said drain of said second active device:

whereby a total transconductance of said first and second transconductances is increased without an increased current utilization and without an increase in noise.

2. The device as recited in claim 1 wherein said first active device is an pMOS device.

3. The device as recited in claim 1 wherein said second active device is a nMOS device.

4. The device as recited in claim I wherein said current reuse circuit steers current into said first active device and said second active device.

5. The device as recited in claim 1 wherein said current reuse circuit further comprises a current mirror and a bias reference current to set a bias current for said first active device and said second active device.

6. The device as recited in claim 1 further comprising a capacitor coupled from said source of said first active device to a first voltage potential.

7. An RF LNA IC having an improved transconductance, the device comprising:

a first active device of a first conductivity type having a first transconductance, a gate, a drain and a source;

a second active device of a second conductivity type having a second transconductance, a gate, a drain and a source, said second active device coupled in series with said first active device and said gate of said first active device is coupled to said gate of said second active device;

a current reuse circuit is coupled to said first active device and said second active device wherein a current flowing from said drain of said first active device is reused in said second active device;

a low pass filter coupled between said current reuse circuit and said drain of said first active device and said drain of said second active device:

whereby a total transconductance of said first and second transconductances is increased without an increased current utilization and without an increase in noise.

8. The device as recited in claim 7 wherein said first active device is an pMOS device.

9. The device as recited in claim 7 wherein said second active device is a nMOS device.

10. The device as recited in claim 7 wherein said current reuse circuit steers current into said first active device and said second active device.

11. The device as recited in claim 7 wherein said current reuse circuit further comprises a current mirror and a bias reference current to set a bias current for said first active device and said second active device.

12. The device as recited in claim 7 further comprising a capacitor coupled from said source of said first active device to a first voltage potential.

13. An RF mixer having an improved transconductance, the device comprising:

a first active device of a first conductivity type having a first transconductance, a gate, a drain and a source;

a second active device of a second conductivity type having a second transconductance, a gate, a drain and a source, said second active device coupled in series with said first active device and said gate of said first active device is coupled to said gate of said second active device;

a current reuse circuit is coupled to said first active device and said second active device wherein a current flowing from said drain of said first active device is reused in said second active device;

a low pass filter coupled between said current reuse circuit and said drain of said first active device and said drain of said second active device:

whereby a total transconductance of said first and second transconductances is increased without an increased current utilization and without an increase in noise.

14. The device as recited in claim 13 wherein said first active device is an pMOS device.

15. The device as recited in claim 13 wherein said second active device is a nMOS device.

16. The device as recited in claim 13 wherein said current reuse circuit steers current into said first active device and said second active device.

17. The device as recited in claim 13 wherein said current reuse circuit further comprises a current mirror and a bias reference current to set a bias current for said first active device and said second active device.

\* \* \* \* \*